(12) United States Patent
Hechtl et al.

(10) Patent No.: US 7,160,650 B2
(45) Date of Patent: Jan. 9, 2007

(54) METHOD OF INSPECTING A MASK

(75) Inventors: Christoph Hechtl, Freising (DE); Jens Lohse, Allen, TX (US); Peter Schäffler, Essenbach (DE)

(73) Assignee: Texas Instruments Incorporated, Dallas, TX (US)

( * ) Notice: Subject to any disclaimer, the term of this patent is extended or adjusted under 35 U.S.C. 154(b) by 137 days.

(21) Appl. No.: 10/631,082

(22) Filed: Jul. 31, 2003

(65) Prior Publication Data

US 2004/0066963 A1     Apr. 8, 2004

(30) Foreign Application Priority Data

Aug. 6, 2002   (DE) ................. 102 36 027

(51) Int. Cl.
*G03F 9/00*     (2006.01)
*G06K 9/00*     (2006.01)

(52) U.S. Cl. ............... 430/5; 430/30; 382/144

(58) Field of Classification Search ............ 430/5, 430/30; 382/144
See application file for complete search history.

(56) References Cited

U.S. PATENT DOCUMENTS 4,906,326 A    3/1990  Amemiya et al.
5,795,688 A *  8/1998  Burdorf et al. ............... 430/30
6,426,168 B1 * 7/2002  Johnson ........................ 430/30
2002/0024019 A1  2/2002  Matsuoka

FOREIGN PATENT DOCUMENTS

DE    689 23 638 T2    1/1996
DE    101 41 422 A1    5/2002
EP    0 334 680 B1     8/1995

* cited by examiner

*Primary Examiner*—Christopher G. Young
(74) *Attorney, Agent, or Firm*—Jacqueline J. Garner; W. James Brady, III; Frederick J. Telecky, Jr.

(57) ABSTRACT

The invention relates to a method of inspecting a mask comprising the steps: patterning a semiconductor material with a reference mask, patterning the semiconductor material with the mask as the inspection item, inspecting both patterns on the semiconductor material by means of an apparatus suitable for inspecting the semiconductor material, and comparing the pattern generated by the inspection item mask to the pattern generated by the reference mask to detect deviations in the inspection item mask from the reference mask. The invention is particularly suitable for reticle inspection. When a semiconductor wafer is multiply patterned by the reference mask and the inspection item mask alternatingly side-by-side, deviations in the reticles are evident as recurrent discrepancies between the patterns on the wafer.

15 Claims, 1 Drawing Sheet

|    | 1 | 2 | 3 | 4 | 5 | 6 | 7 | 8 | 9 | 10 | 11 |
|----|---|---|---|---|---|---|---|---|---|----|----|
| 1  |   | ○ | * | ○ | * | ○ | * | ○ | * |    |    |
| 2  | * | ○ | * | ○ | * | ○ | * | ○ | * | ○  |    |
| 3  | * | ○ | * | ○ | * | ○ | * | ○ | * | ○  |    |
| 4  | * | ○ | * | ○ | * | ○ | * | ○ | * | ○  |    |
| 5  | * | ○ | * | ○ | * | ○ | * | ○ | * | ○  |    |
| 6  | * | ○ | * | ○ | * | ○ | * | ○ | * | ○  |    |
| 7  | * | ○ | * | ○ | * | ○ | * | ○ | * | ○  |    |
| 8  | * | ○ | * | ○ | * | ○ | * | ○ | * | ○  |    |
| 9  |   | ○ | * | ○ | * | ○ | * | ○ | * |    |    |

METHOD OF INSPECTING A MASK

FIELD OF THE INVENTION

The invention relates to a method of inspecting a mask.

BACKGROUND

Masks play a major role in the fabrication of integrated circuits. They find application in the optical transfer of geometrical patterns in designing a circuit on the surface of semiconductor wafers. These masks are mainly used in the lithographic stage in which a light-sensitive auxiliary layer, termed photoresist, is patterned by it being exposed through a mask and subsequently developed. The pattern generated in the photoresist is then transferred to the layer underneath by etching.

Since the semiconductor wafers in the fabrication of integrated circuits pass through the lithographic patterning process several times, it is this step that is central in ultimately dictating the costs of semiconductor component production. Since the requirements on the accuracy are very high, this is the factor that makes the lithography highly cost-intensive. Each mask must pass a clearance test before being used for the first time in chip production to verify agreement of the mask content with the circuit design and compliance with the mask specifications while testing the mask for defects.

Apart from this, it is often the case that changes are made to the circuit design during production which thus need to be implemented on the mask. For instance, it may be discovered that better results are achieved with a mask having patterns slightly reduced in size. It is sometimes the case that test patterns on the mask are altered so that they are not translated into the circuits on the wafer, but instead serve to, for example, align the mask relative to the wafer. Making such changes in the course of production harbors the risk, however, of the new mask containing not only the intended changes, but also of incidental deviations finding their way into the system. Although devices are known for testing masks, these are very expensive and thus are normally not available in the field of component production. This is why, hitherto when changes have been made, it is often the case that the new mask is used as a trial on a number of wafers in electrically testing to determine whether the result is satisfactory. This procedure wastes a lot of valuable time, however, until it is assured that the new mask is suitable for fabrication.

SUMMARY OF THE INVENTION

The invention is based on the objective of providing a simple method of inspecting a mask such that a mask can be inspected for defects by means as available in component production cost-effectively and time savingly.

To achieve this objective the invention defines a method of inspecting a mask comprising the steps of patterning a semiconductor material with a reference mask, patterning the semiconductor material with the mask as the inspection item, inspecting both patterns on the semiconductor material by means of an apparatus suitable for inspecting the semiconductor material, and comparing the pattern generated by the inspection item mask to the pattern generated by the reference mask to detect deviations in the inspection item mask from the reference mask.

This method is especially simple because instead of the circuit design a reference mask is made use of for checking the mask as the inspection item. Since this involves comparison of the patterns of both masks transferred to the semiconductor material, recourse can now be made to apparatus as used in the production of semiconductor components for inspecting the processed semiconductor wafers for defects and available in any case. Comparing several such patterns generated by the inspection item mask and the reference mask exposes deviations in the inspection item mask from the reference mask as recurrent discrepancies which can then be analyzed.

Further advantageous aspects of the invention in accordance with the invention read from the sub-claims.

BRIEF DESCRIPTION OF THE DRAWING

An example embodiment of the invention will now be detained with reference to the drawing in which FIG. 1 is a diagram illustrating a possible array of patterns generated by a reference mask and an inspection item mask on a wafer.

DETAILED DESCRIPTION

In the following description it is assumed that the mask as the inspection item is the result of a change undertaken in chip production. This change may be a reduction in size of the mask patterns, for example, by 0.1 □m. However, it could just as well involve an increase in size of the mask patterns or some other change to the mask. The reference mask employed is then the mask as used prior to the change.

However, the method in accordance with the invention is not restricted in application to verifying changes in the mask. It is just as conceivable to make use of the method in other cases in which checking the mask is needed. The requirement for application of the method in accordance with the invention is that a reference mask is available which is known to feature the desired pattern.

It is particularly of advantage to make use of the method in accordance with the invention for inspecting reticules. A reticule is a mask containing only a small number of chip areas to final size or increased in size employed as the original in step-and-repeat cameras. To inspect a reticule the wafer is alternatingly patterned by the inspection item reticule and by the reference reticule at different sites. Alternating between the two reticules is done either during exposure, or exposure is sequenced by firstly exposing one portion of the sites on the wafer with one of the two reticules and then exposing the other portion of the sites with the other of the two reticules.

Referring now to FIG. 1 there is illustrated an expedient array of the patterns generated on the wafer by the two reticules. To compare the patterns with the aid of a conventional apparatus the patterns generated by the inspection item reticule and the reference reticule must alternate in a line. In the array as shown in FIG. 1, the patterns generated by the inspection item reticule and by the reference reticule are arranged in columns. The patterns generated by the reference reticule are identified by an asterisk and the patterns generated by the inspection item reticule are identified by a circle.

The wafer processed as such is then inspected by means of an apparatus as suitable for inspecting wafers for defects such as, for example, KLA Tencor 21X9. The defect inspection apparatus scans the wafer with the aid of a microscope and digitizes the image produced by the microscope. By means of the stored images the side-by-side patterns are compared. Such apparatus currently in use permits setting the edge length of a pixel to a value in the range 0.16 to 1.25

□m. When a deviation is detected in comparing a first pattern to a second pattern and when likewise a deviation is detected in comparing the second pattern to a third pattern, then this indicates that the second pattern is defective.

An apparatus of this kind is able to compare discrete circuits or whole areas corresponding to a chip. Comparing whole semiconductor wafers as is needed for inspecting the masks in whole wafer exposure necessitates correspondingly more capacity of storing the images. In any case, the resolution of the apparatus must be high enough to reliably detect defects in the range of the pattern width lithographically resolvable as a minimum.

Since deviations in the inspection item reticule from the reference reticule occur as recurrent discrepancies, they are easy to distinguish from single defects having occured in patterning the wafer by the mask or from defects in the wafer. The detected discrepancies are analyzed in permitting verification as to whether the intended changes have the desired shape and whether additional, unintentional changes exist. Since a minor reduction in size of the mask pattern of e.g. 0.1 □m is not detected, defects in the inspection item mask can be detected particularly easy in this case.

The invention claimed is:

1. A method of inspecting a mask comprising the steps:
    patterning a semiconductor material with a reference mask,
    patterning the semiconductor material with the mask as the inspection item,
    inspecting both patterns on the semiconductor material by means of an apparatus suitable for inspecting the semiconductor material, and
    comparing the pattern generated by the inspection item mask to the pattern generated by the reference mask to detect deviations in the inspection item mask from the reference mask; wherein one or more semiconductor wafers are multiply patterned by the reference mask and by the inspection item mask, the patterns generated by the reference mask are compared to the patterns generated by the inspection item mask in pairs, recurrent discrepancies between the two patterns compared are detected and deviations in the inspection item mask from the reference mask being established from the recurrent discrepancies.

2. The method as set forth in claim 1 wherein patterning the semiconductor material by the mask is done lithographically.

3. The method as set forth in claim 1 wherein the masks are reticules.

4. The method as set forth in claim 3 wherein patterning by the reference reticule and by the inspection item reticule is done side-by-side on a single wafer.

5. The method as set forth in claim 4 wherein the patterns of the reference reticule and of the inspection item reticule are arranged alternatingly side-by-side in columns on the wafer.

6. The method as set forth in claim 4 wherein two patterns located side-by-side on the wafer are each compared in sequence.

7. The method as set forth in claim 4 wherein three patterns located side-by-side on the wafer are each compared in sequence.

8. The method as set forth in claim 1 wherein the inspection item mask features an intentional change as compared to the reference mask.

9. The method as set forth in claim 8 wherein the pattern of the inspection item mask is increased or reduced in size as compared to the pattern of the reference mask.

10. The method as set forth in claim 9 wherein the pattern of the inspection item mask is reduced in size by 0.1 μm as compared to the pattern of the reference mask.

11. The method as set forth in claim 1 wherein the apparatus suitable for inspecting semiconductor material generates a digitized image of a portion of a wafer.

12. The method as set forth in claim 11 wherein the apparatus suitable for inspecting the semiconductor material compares the digitized images of patterns located side-by-side.

13. The method as set forth in claim 11 wherein the resolution of the apparatus suitable for inspecting the semiconductor material is high enough to reliably detect deviations in the range of the pattern width lithographically resolvable as a minimum when comparing two images.

14. A method of inspecting a mask comprising the steps:
    patterning a semiconductor material with a reference mask,
    patterning the semiconductor material with the mask as the inspection item,
    inspecting both patterns on the semiconductor material by means of an apparatus suitable for inspecting the semiconductor material, and
    comparing the pattern generated by the inspection item mask to the pattern generated by the reference mask to detect deviations in the inspection item mask from the reference mask, wherein the inspection item mask features an intentional change as compared to the reference mask and wherein the pattern of the inspection item mask is increased or reduced in size as compared to the pattern of the reference mask.

15. The method as set forth in claim 14 wherein the pattern of the inspection item mask is reduced in size by 0.1 μm as compared to the pattern of the reference mask.

* * * * *